United States Patent [19]

Raab et al.

[11] Patent Number: 5,293,343

[45] Date of Patent: Mar. 8, 1994

[54] DYNAMIC SEMICONDUCTOR MEMORY HAVING A READ AMPLIFIER DRIVE CIRCUIT FOR ACHIEVING SHORT ACCESS TIMES WITH A LOW TOTAL PEAK CURRENT

[75] Inventors: Wolfgang Raab, München; Heribert Geib, Grafing, both of Fed. Rep. of Germany

[73] Assignee: Siemens Aktiengesellschaft, Munich

[21] Appl. No.: 988,956

[22] PCT Filed: Sep. 3, 1991

[86] PCT No.: PCT/DE91/00697

§ 371 Date: Mar. 10, 1993

§ 102(e) Date: Mar. 10, 1993

[87] PCT Pub. No.: WO92/05558

PCT Pub. Date: Apr. 2, 1992

[30] Foreign Application Priority Data

Sep. 20, 1990 [DE] Fed. Rep. of Germany ....... 4029847

[51] Int. Cl.$^5$ ............................................. G11C 7/00
[52] U.S. Cl. ................................... 365/205; 365/204; 365/230.03
[58] Field of Search ........... 365/205, 204, 207, 189.01, 365/230.03, 230.06

[56] References Cited

U.S. PATENT DOCUMENTS

| | | | |
|---|---|---|---|
| 4,916,671 | 4/1990 | Ichiguchi | 365/207 |
| 5,051,954 | 9/1991 | Toda et al. | 365/230.03 |
| 5,189,639 | 2/1993 | Miyatake | 365/205 |

Primary Examiner—Eugene R. LaRoche
Assistant Examiner—Tan Nguyen
Attorney, Agent, or Firm—Hill, Steadman & Simpson

[57] ABSTRACT

The dynamic semiconductor memory is divided into word line blocks and bit line blocks, word line blocks consisting of a plurality of bit line blocks, which includes for each bit line block a local SAN driver (LTN) and an decelerator circuit for driving the read amplifiers (LV1 ... LVi) associated with the respective bit line block, and the accelerator circuits of which can be driven in such a way that, to achieve a low total peak current, only the accelerator circuit belonging to the bit line block is active whose bit lines are switched through to IO lines (IO, ION). The accelerator circuit consists, for example, of only one driver transistor ($NT_{n+1}$) in each case.

12 Claims, 4 Drawing Sheets

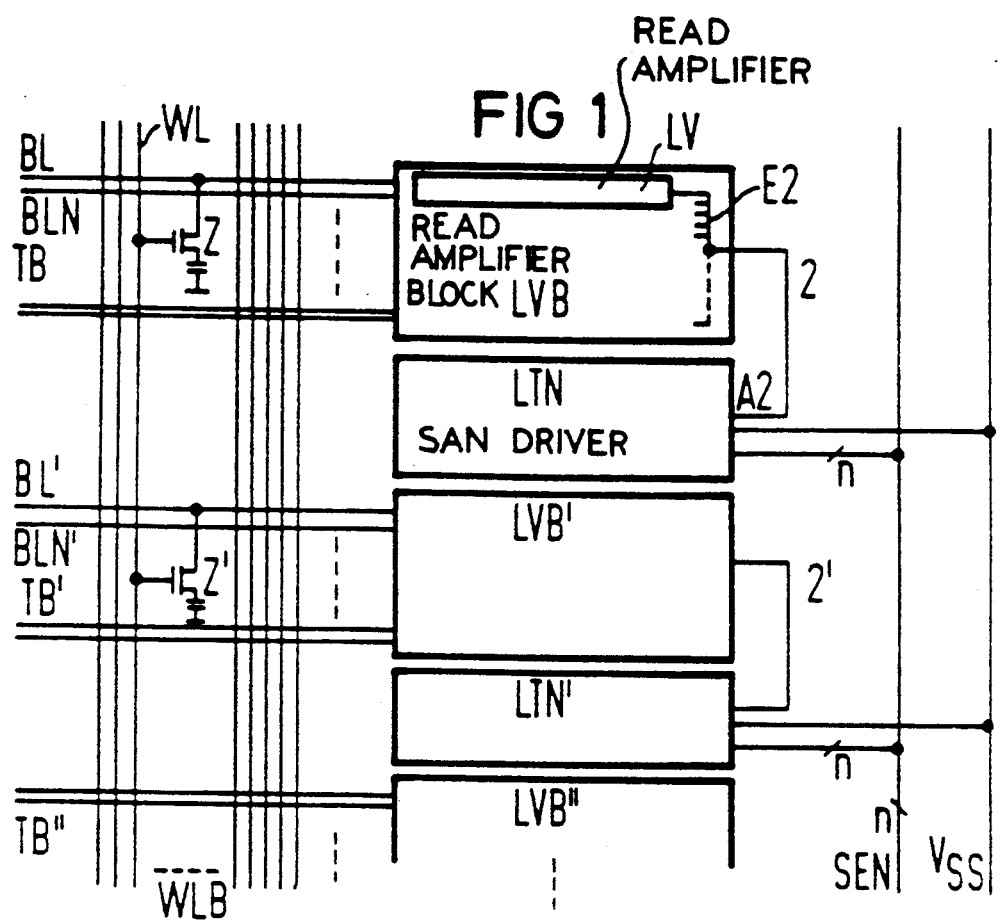
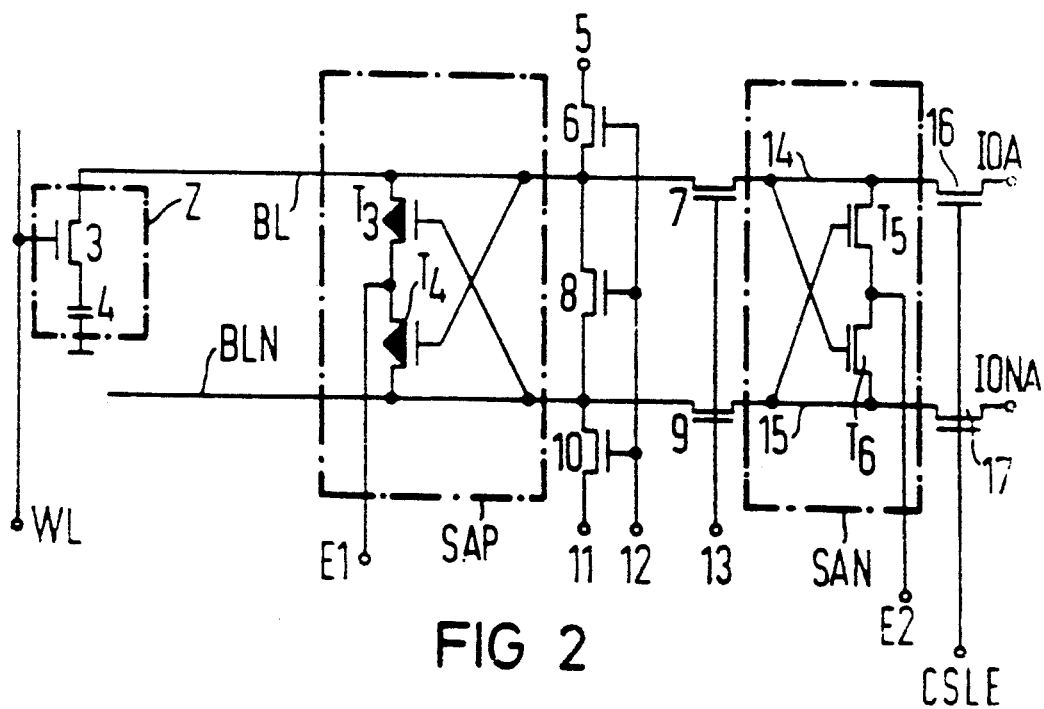

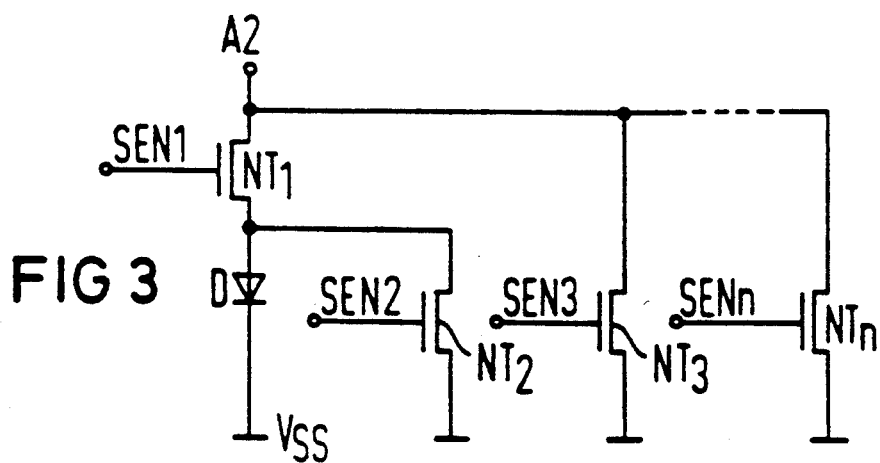
FIG 3
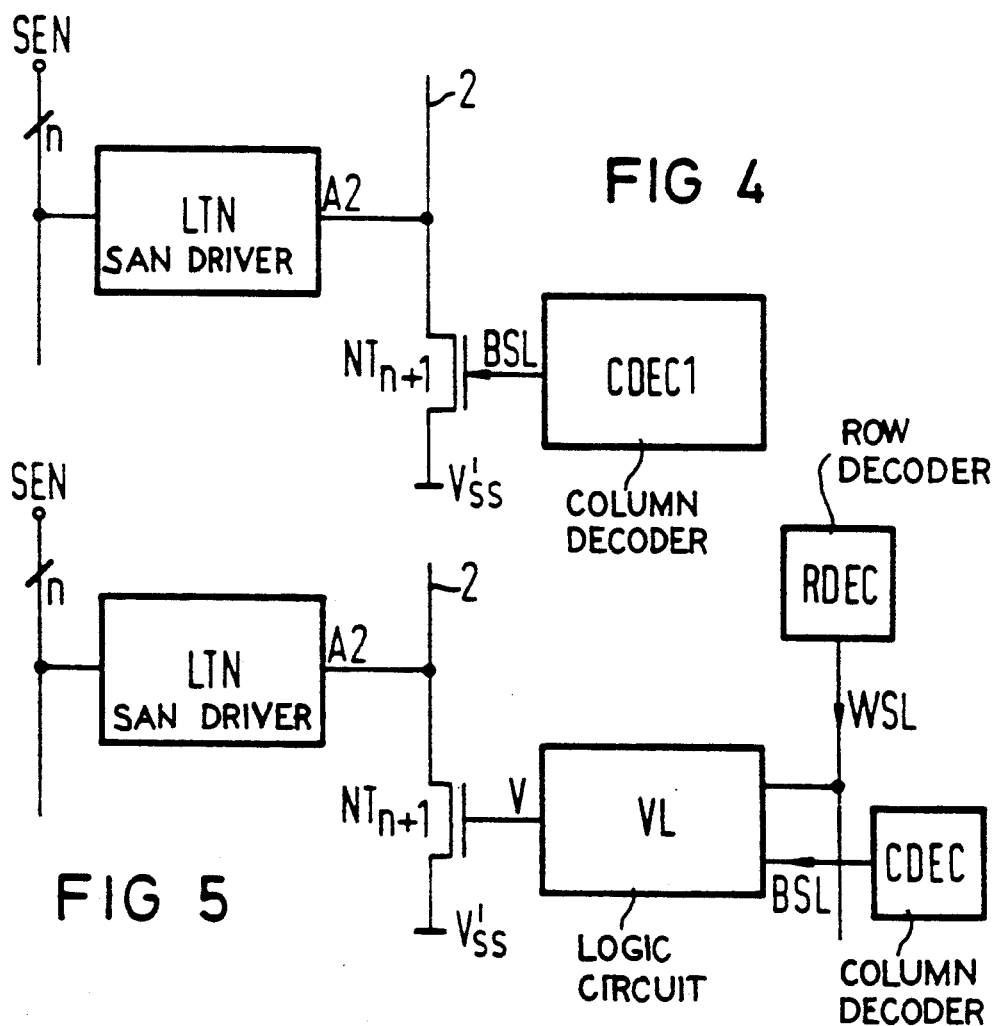
FIG 4
FIG 5

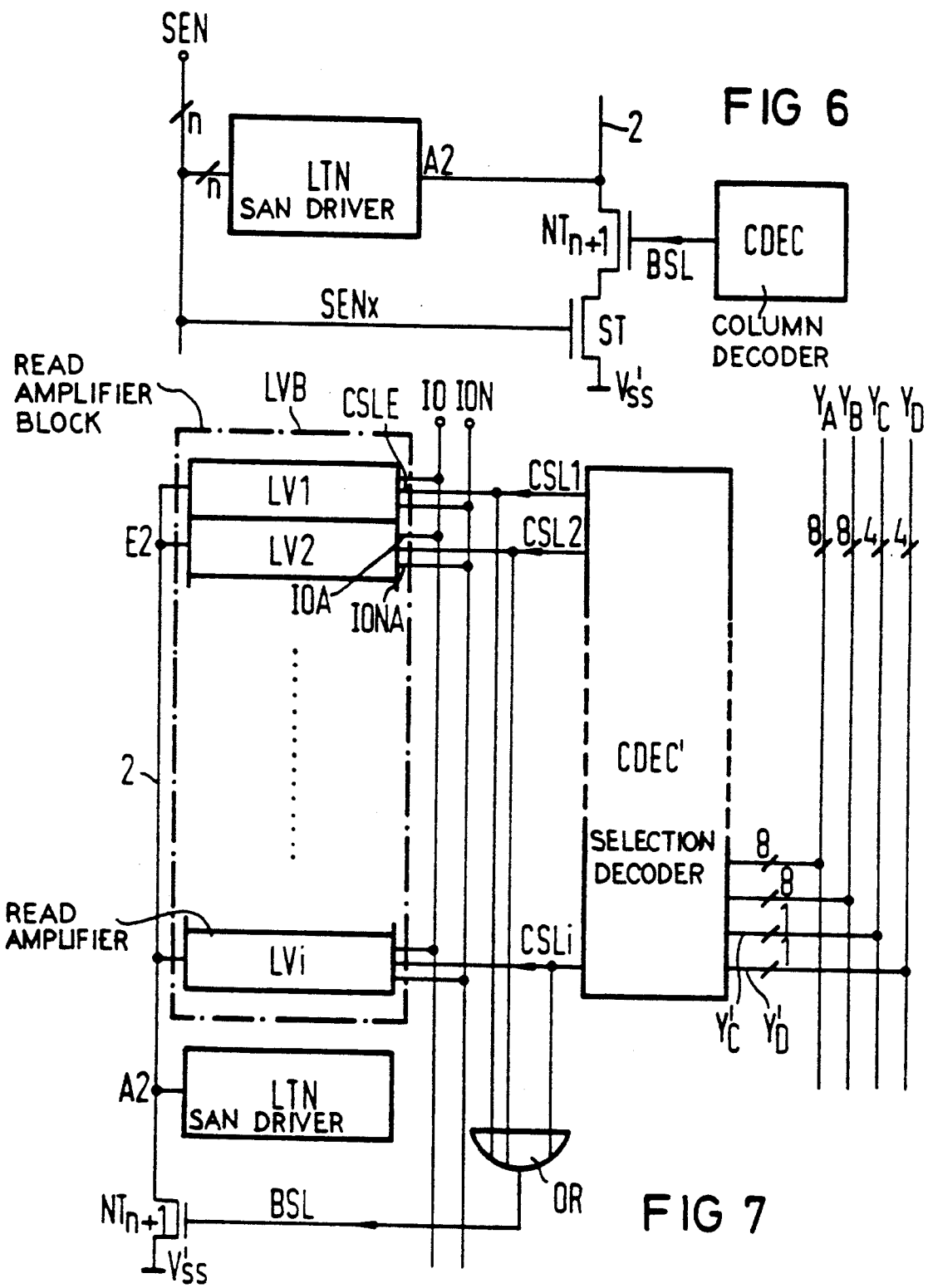

DYNAMIC SEMICONDUCTOR MEMORY HAVING A READ AMPLIFIER DRIVE CIRCUIT FOR ACHIEVING SHORT ACCESS TIMES WITH A LOW TOTAL PEAK CURRENT

BACKGROUND OF THE INVENTION

The invention relates to a dynamic-semiconductor memory.

A dynamic semiconductor memory in which all the read amplifiers are connected via in each case one transistor, connected as a resistor, to a common SANN line which has a line impedance and can be connected via a single common driver transistor (global SAN driver) to reference potential, and in which one SAN input of a respective read amplifier can be connected to reference potential via a respective further transistor, which can be driven from a column decoder via a bit-line selection signal, has been disclosed in the publication having the title "Decoded-Source Sense Amplifier For High-Density DRAM's" by Okamura et al. (Toshiba), from the Digest of Technical Papers from the 1989 Symposium on VLSI Circuits (pages 103 to 104). The transistors which are connected as resistors are provided in order that the read amplifiers are not driven significantly differently as a function of the geometric distance to the common driver transistor, as a result of the line impedance, and in order that certain mutual decoupling of the SAN inputs of the read amplifiers takes place. In this case, only one common driver transistor (global SAN driver) is required and not, as in the case of the invention, a plurality of existing local SAN drivers, but in each case one transistor connected as a resistor and one transistor driven by the column decoder are required for this purpose per read amplifier.

A further prior publication by Okamura et al. (IEEE Journal of Solid-State Circuits, Vol. 25, No. 1, February 1990, pages 18–22) additionally discloses, for example, in each case four read amplifiers having to be connected to a common SANN line via a transistor connected as a resistor, and the SAN inputs of these read amplifiers having to be connected to reference potential via only one further transistor, which can be driven by the column decoder, in order to save chip area. However, for example, this has the disadvantage that only partial decoding is possible.

IEEE Journal of Solid-State Circuits, Vol. Sc-22, No. 5, October 1987, pages 651 to 656 discloses a semiconductor memory in which in each case one multi-phase SAN driver which is common (global) to all the read amplifiers is connected to one end of a common SANN line per word line block, and, in addition, a driver transistor is connected to the other end of the SANN line, the function of the driver transistor not, however, being dependent on bit-line selection signals and hence acting simultaneously on all the read amplifiers of a word line block.

SUMMARY OF THE INVENTION

The object of the invention is to disclose a dynamic semiconductor memory of the type mentioned at the beginning which makes short access times possible with a minimum chip area requirement and a low total peak current. This object is achieved according to the invention by a dynamic semiconductor memory having the following elements:

- a memory cell arrangement which has at least one word line block, at least one word line block being composed of a multiplicity of bit line blocks, one bit line block in each case having a multiplicity of bit line pairs; a multiplicity of read amplifier blocks which in each case have a multiplicity of read amplifiers, in each case one read amplifier being connected to a bit line pair of a bit line block which is allocated to the respective read amplifier block and being constructed from an n-channel part and a p-channel part;
- read amplifiers whose amplified read signals can be switched through to IO lines as a function of bit-line selection signals, it being possible to produce the bit-line selection signals by means of a column decoder;
- a multiplicity of local SAN drivers of which in each case one is provided for the common drive of the n-channel parts of the read amplifiers of a respective read amplifier block;
- local SAN drivers which, in order to achieve accelerated evaluation with a low peak current, in each case additionally have an acceleration circuit with a driver transistor and are in each case connected to a connection of the driver transistor; and
- acceleration circuits which can be driven such that the accelerated evaluation takes place only in that read amplifier block in which the amplified read signals are also switched through to the IO lines as a function of the bit-line selection signals.

The particular advantage conferred by the invention is that with the dynamic semiconductor memory designed according to the invention, in comparison with the cited dynamic semiconductor memory from Toshiba, substantially less space is required as a result of an accelerator circuit, present in the manner of a block, for reducing the evaluation time.

Further development of the present invention are as follows.

The accelerator circuit has only the driver transistor. A second terminal of the driver transistor can be directly driven by a bit line block selection signal, provided that separate column decoders are provided for individual word line blocks. The third terminal of the driver transistor is directly connected to a reference potential line.

The accelerator circuit consists only of the driver transistor. For driving, a second terminal of the driver transistor is connected to the output of a logic circuit and, by means of the logic circuit, a bit line block selection signal is gated with a word line block selection signal, inasmuch as a common, superordinate column decoder is provided for a plurality of word line blocks. The third terminal of the driver transistor is directly connected to a reference potential line. The logic circuit has an AND gate.

The accelerator circuit includes the driver transistor and a selection transistor. A second terminal of the driver transistor can be directly driven by a bit line block selection signal. The third terminal of the driver transistor is connected to a first terminal of the selection transistor. In order to select a word line block, a second terminal of the selection transistor can be driven via a drive line of a local SAN driver. The third terminal of the selection transistor is connected to a reference potential line. Given an n-phase SAN driver with n drive lines the second terminal of the selection transistor can be driven via the drive line of the temporally last, nth phase.

The column decoder includes an addressable selection decoder for generating a bit line selection signals and a supplementary circuit for generating is bit line block selection signal. Column address lines are connected to the selection decoder for forming the bit line selection signals. In each case all bit line selection signals of the selection decoder are gated by means of a supplementary circuit in the form of an OR circuit to form a bit line block selection signal. In a further embodiment the selection decoder includes an input for addressing. An output of the supplementary circuit carrying the bit line block selection signal is connected to an input for addressing the selection decoder. Inputs of the supplementary circuit are connected to further column address lines. In yet another further embodiment the selection decoder includes inputs for addressing and these inputs are connected to further column address lines. Inputs of the supplementary circuit are connected to further column address lines. The supplementary circuit can consist of an AND gate.

The accelerator circuit is connected to a first reference potential line and the local SAN driver is connected to a second reference potential line which is separate from the first reference potential line.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a dynamic semiconductor memory having read amplifier blocks consisting of read amplifiers and local SAN drivers, FIG. 2 shows a detailed circuit of a read amplifier according to FIG. 1 coupled to a memory cell, FIG. 3 shows a detailed circuit of an SAN driver, FIG. 4 shows a local SAN driver together with an accelerator circuit driven by a column decoder, for a semiconductor memory according to the invention, inasmuch as separate column decoders are provided for each word line block, FIG. 5 shows a local SAN driver together with an accelerator circuit driven by a superordinate column decoder and a row decoder, for a semiconductor memory according to the invention, FIG. 6 shows a local SAN driver together with an accelerator circuit driven by a superordinate column decoder, for a semiconductor memory according to the invention, for the case where the accelerator circuit consists of a driver transistor and a selection transistor and superordinate column decoders are present, FIG. 7 shows a circuit for driving an accelerator circuit having an addressable selection decoder and an additional circuit in the form of an OR circuit, for a semiconductor memory according to the invention.

DESCRIPTION OF THE PREFERRED EMBODIMENT

Figure 7A:
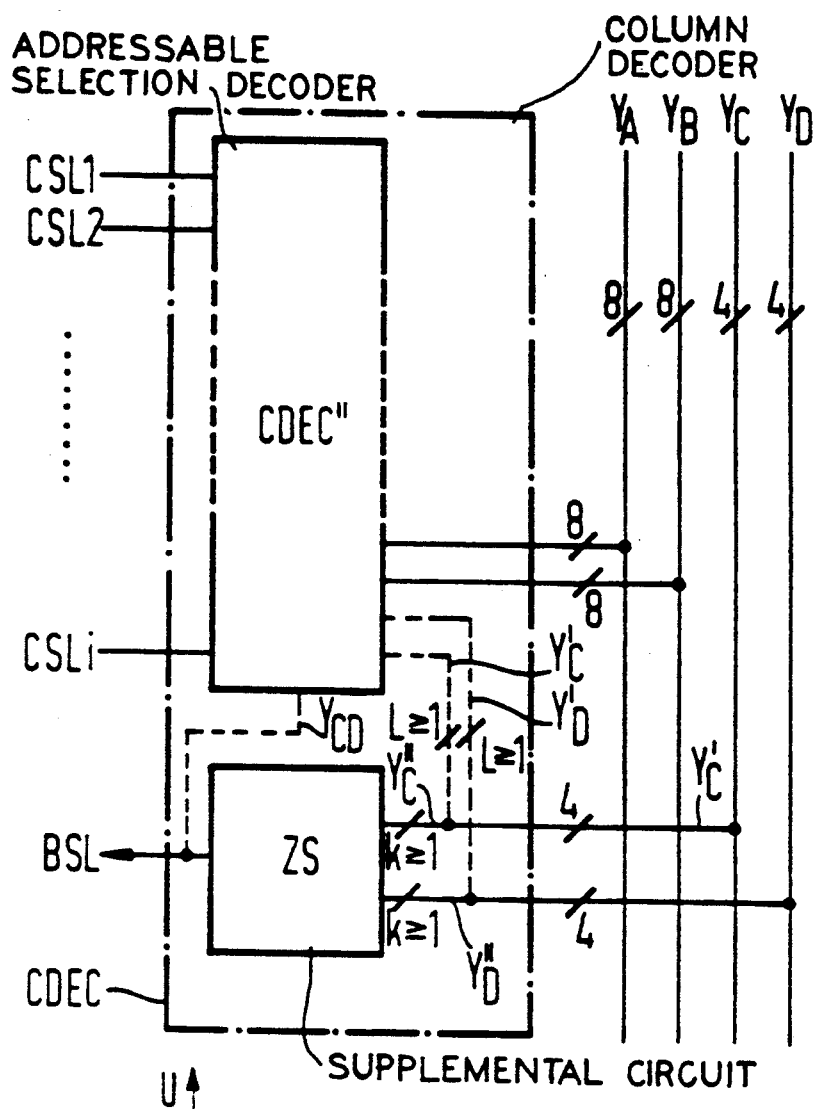
FIG. 7a shows a representation with circuit alternatives to FIG. 7.

FIG. 1 shows part of a dynamic semiconductor memory having a multiplicity of word lines WL which are combined to form word line blocks WLB and having a plurality of bit line pairs BL and BLN or BL' and BLN', which are grouped to form bit line blocks TB and TB', respectively. In the bit line block TB, for example, a memory cell Z is wired to a word line WL and a bit line BL, the gate terminal of the transistor of the memory cell Z being connected to the word line WL, the drain terminal being connected to the bit line BL and the source terminal being connected via a cell capacitor to reference potential. A read amplifier block LVB consists of a plurality of read amplifiers LV which are connected to bit line pairs BL, BLN and have SAN inputs E2. The SAN inputs E2 are connected via a local a SANN line 2 to an output A2 of a local SAN driver LTN. This local SAN driver LTN is in turn connected to n drive lines SEN and a reference voltage line $V_{SS}$. This applies analogously to the further bit line blocks TB', TB'', etc. Thus, a further bit line block TB' represented has, for example, a bit line pair BL' and BLN', memory cells Z', a read amplifier block LVB', a local SANN line 2' and a local SAN driver LTN'. Only one read amplifier block LVB'' is shown here for the bit line block TB''.

The memory cell Z addressed by the bit line BL and the word line WL is read by the read amplifier LV and evaluated. For reliable, but nevertheless fast, evaluation, the concept with local SAN drivers LTN, which have an optimised drive function, is particularly advantageous. In this case a local SAN driver LTN drives a read amplifier block having, for example, 64 read amplifiers. The n drive lines SEN are present for n-phase driving of the SAN driver LTN.

FIG. 2 represents the circuit of a conventional read amplifier with coupled memory cell Z. In this case the read amplifier essentially consists of an n-channel part SAN and a p-channel port SAP. The p-channel part SAP is connected directly to the bit line pair BL and BLN and consists of two p-channel transistors T3 and T4. The drain terminal of T3 is connected to the bit line BL, the source terminal of T3 is connected to the drain terminal of T4, and the gate terminal of T3 is connected to the bit line BLN. The SAP input El is connected to the drain terminal of the transistor T4, the source terminal is connected to the bit line BLN, and the gate of the transistor T4 is connected to the bit line BL. The n-channel part SAN is cross-coupled in a manner similar to the p-channel part SAP and consists of the two n-channel transistors T5 and T6. The drain terminal of the transistor T5 is in this case connected to the bit line section 14, the source terminal of the transistor T5 is connected to the drain terminal of the transistor T6, and the gate of the transistor T5 is connected to the bit line section 15. The drain terminal of the transistor T6 is connected to the SAN input E2, the source terminal of the transistor T6 is connected to the bit line section 15, and the gate terminal of the transistor T6 is connected to the bit line section 14. The two transfer transistors 7 and 9, which can be driven by a drive line 13, are located between the bit line pair BL, BLN and the bit line sections 14 and 15. The bit line sections 14 and 15 can be connected through to the IO outputs IOA and IONA by the two further transfer transistors 16 and 17. The gates of the transistors 16 and 17 are connected to a bit line selection input CSLE. Three further n-channel transistors 6, 8 and 10 form a short-circuit/pre-charging circuit, in which the drain terminal of the transistor 6 is connected to an input 5, the source terminal is connected to the bit line BL, and the gate terminal is connected to an input 12, the drain terminal of the transistor 8 is connected to the bit line BL, the source terminal is connected to the bit line BLN, the gate terminal is connected to the input 12, the drain terminal of the transistor 10 is connected to the bit line BLN, the source terminal is connected to an input 11, and the gate terminal is connected to the input 12. The drain terminal of the transistor 3 of the memory cell Z is connected to the bit line BL, the source terminal is connected via the cell capacitor 4 to reference potential, and the gate is connected to the word line WL.

As a result of the short-circuit/precharging circuit with the transistors 6, 8 and 10, the bit lines BL and BLN are temporarily short-circuited and charged to the same precharge level. Given conductive transfer transistors 7 and 9, all cells addressed by a word line WL are read out to the precharged bit lines. Thus, for example, the memory cell Z represented in FIG. 2 is read out to the bit line BL and is evaluated by the cross-coupled n-channel transistors $T_5$ and $T_6$, a differential voltage between the bit lines BL and BLN being amplified. The two cross-coupled p-channel transistors T3 and T4 support here the further evaluation operation. Once the evaluation operation has been completed, the two transfer transistors 16 and 17 are switched to conductive by a bit line selection signal at the bit line selection input CSLE, and the bit lines BL and BLN are switched through to the IO outputs IOA and IONA. The SAN input E2 must be brought to reference potential as quickly as possible to activate the n-channel part SAN. A suitable control voltage is required at the input E2 to ensure that activation is as fast as possible but nevertheless no incorrect evaluation occurs. A suitable control voltage with optimized voltage/time function may be generated, for example, in an SAN driver. This applies analogously to the SAP input E1.

FIG. 3 represents a possible SAN driver. In this case it is a local n-phase SAN driver which can be driven by means of n drive lines SEN1 to SENn. The drain terminal of one transistor $NT_1$ is connected to the driver output A2, the source terminal is connected via a diode D to a reference potential line $V_{SS}$, and the gate terminal is connected to the temporally first phase SEN1 of the n control lines SEN. The diode D is here polarised in the forward direction, and connected parallel to it is a transistor $NT_2$ whose gate is connected to the line SEN2. The drain terminal of a transistor $NT_3$ is connected to the driver output A2, the source terminal is connected to the reference potential line $V_{SS}$, and the gate terminal is connected to a third drive line SEN3. In a similar way to $NT_3$, further transistors up to $NT_n$ can be connected in parallel with the transistor $NT_3$ in order to obtain as good an approximation of an ideal drive curve as possible. In this case the gate of the nth driver transistor $NT_n$ is connected to the drive line SENn. It is of lesser importance whether the signals of the drive lines SEN1 . . . SENn can be formed outside the local SAN driver, or whether they can be formed in the local SAN drivers from, for example, the signal of the drive line SEN1 in each case by delay circuits.

If the control line SEN1 receives high potential, then the transistor $NT_1$ becomes conductive and the voltage at the driver output A2 assumes the threshold voltage of the diode D. As soon as the second drive line SEN2 now receives high potential, the driver transistor $NT_2$ likewise becomes conductive, and located between the driver output A2 and the reference potential line $V_{SS}$ are the two series-connected channel resistors of the transistors $NT_1$ and $NT_2$, which produce a voltage drop at A2 as a result of the driver current. As a result of the driver transistors $NT_3$ to $NT_n$ successively also becoming conductive, channel resistors are connected in parallel and lead to a lower voltage between A2 and the reference potential line $V_{SS}$ due to the lower total resistance.

FIG. 4 shows an accelerator circuit which consists only of one driver transistor $NT_{n+1}$ and is part of a dynamic semiconductor memory according to the invention. The driver transistor $NT_{n+1}$ is driven at its gate terminal by a bit line block selection signal BSL only when, as in this case, separate column decoders CDEC1 are present for each word line block. The drain terminal of the driver transistor $NT_{n+1}$ is connected to the output A2 of a local SAN driver LTN, and its source terminal is in contact with a reference potential line $V'_{SS}$. The reference potential line $V'_{SS}$ is advantageously constructed separately from a reference potential line $V_{SS}$ for local SAN drivers, since this prevents a mutual influencing as a result of voltage drops on supply lines. The local SAN driver is driven by n drive lines SEN, and its output A2 is connected to a local SANN line 2.

When a dynamic semiconductor memory according to the invention is read, all local n-phase SAN drivers of a word line block WLB are driven by n common drive lines SEN. The voltage of the local SANN line 2 drops here to a value denoted by P in FIG. 8. As long as all driver transistors $NT_{n+1}$ of a word line block WLB are still nonconductive, evaluation is carried out without acceleration. If the bit line block selection signal now receives high potential from the column decoder CDEC1, the driver transistor $NT_{n+1}$ becomes conductive and the local SANN line is brought relatively quickly to reference potential. A relatively high peak current is required on the local SANN line in order to discharge the local SANN line 2 to reference potential relatively quickly. Since this high peak current only occurs in a single bit line block in a semiconductor memory according to the invention, however, the total peak current of the dynamic semiconductor memory according to the invention is increased only insignificantly by the accelerator circuit.

The circuit shown in FIG. 5 relates to a dynamic semiconductor memory according to the invention in which the superordinate column decoders CDEC are available for a plurality of word line blocks simultaneously. The circuit shown in FIG. 5 differs from the circuit shown in FIG. 4 only with respect to the driving of the driver transistor $NT_{n+1}$. To select a bit line block unambiguously, the bit line block selection signal BSL must first be gated with a word line block selection signal WSL in a logic circuit VL. For this purpose the output V of the logic circuit VL is connected to the gate of the driver transistor $NT_{n+1}$. The formation of the bit line block selection signal in the column decoder CDEC is described in more detail in the description for FIGS. 7 and 8. The formation of the word line block selection signal WSL takes place in a row decoder, in which, as with the column decoder, usually precoded address lines are combined by logic operations to form a word line block selection signal WSL. If the driver transistor $NT_{n+1}$ were driven only by the bit line block selection signal BSL, then although only the word line block WLB addressed by the bit line selection signal BSL by means of the drive lines SEN could be evaluated, the relatively high currents across the driver transistors would consequently also flow in the other word line blocks and would have an unfavorable effect on the total peak current.

The accelerator circuit of a dynamic semiconductor memory according to the invention shown in FIG. 6 consists of a driver transistor $NT_{n+1}$ and of a selection transistor ST, the two transistors being connected in series in such a way that the drain terminal of the driver transistor $NT_{n+1}$ is connected to a local SANN line 2, and the source terminal of the driver transistor $NT_{n+1}$ is connected to the drain terminal of the selection transistor, and its source terminal is connected to the reference potential line $V'_{SS}$. A local SAN driver is, as described for FIGS. 4 and 5, driven by n drive lines SEN, and its output A2 is connected to the local SANN line 2. A single drive line SENx of the n drive lines SEN is connected to the gate of the selection transistor ST. The gate of the selection transistor ST is preferably driven by the last, nth phase of the drive line SENn. A word line block is unambiguously defined by the drive line SENx, since the column decoder is superordinate and drives a plurality of word line blocks simultaneously. The bit line block is selected, as in FIG. 4, by a bit line block selection signal BSL, which can be formed in a column decoder CDEC.

The signals of the n drive lines SEN generated from row addresses successively receive high potential with a time offset to successively generate all n phases of the local SAN driver LTN. Since the n drive lines SEN are present separately for each word line block, a word line block can be selected by one of the n drive lines SEN. Since the driver transistor $NT_{n+1}$ of the selected bit line block only becomes conductive, by means of the bit line block selection signal BSL, at a time $n+1$ after all n stages of a local SAN driver have already been switched on, the drive line SENx of the nth phase $(x=n)$ is sufficient for driving the selection transistor ST. As a result of the selection transistor ST connected in series with the driver transistor $NT_{n+1}$, only the bit line block associated with the selected word line block receives an decelerated evaluation, and hence the total peak current is increased only insignificantly, although a bit line block is selected by means of the bit line selection signal BSL in each word line block by the superordinate column decoder CDEC.

One possibility for generating a block selection signal BSL in the dynamic semiconductor memory according to the invention is shown in FIG. 7. In the circuit represented in FIG. 7, the accelerator circuit consists only of a driver transistor $NT_{n+1}$ which, as in FIG. 4, can be directly driven by means of the bit line block selection signal BSL. However, the driver transistor can also be driven, as in FIG. 5, via a logic circuit VL or, as in FIG. 6, with a selection transistor ST connected in series. The drain terminal of a driver transistor $NT_{n+1}$ is connected to the output A2 of a local SAN driver LTN and via a local SANN line 2 to the inputs E2 of the read amplifiers LV1 . . . LVi of a read amplifier block LVB. The source terminal of the drive transistor $NT_{n+1}$ is in contact with a reference potential line $V'_{SS}$. The IO outputs IOA and IONA of the read amplifiers LV1 . . . LVi are connected in each case to IO lines IO and ION. At its outputs an addressable selection decoder CDEC' generates bit line selection signals CSL1 . . . CSLi, which can be fed into the bit line selection inputs CSLE of read amplifiers LV1 . . . LVi. A (1 from i) selection takes place in the selection decoder CDEC', that is to say in each case only one bit line selection signal, for example, CSL1, is switched to high potential and the remaining bit line selection signals carry low potential. Since all bit lines selected by the bit line selection signals CSL1 . . . CSLi belong to the same bit line block LVB, all bit line selection signals CSL1 . . . CSLi are gated to form a bit line block selection signal BSL by means of an OR circuit OR. Selection inputs of the addressable column decoder CDEC' are connected to precoded, for example (1 from 8) - precoded, column addresses $Y_A$ and $Y_B$, and the address inputs of the addressable column decoder CDEC' are connected to a part $Y'_C$ and $Y'_D$ of the precoded, for example (1 from 4)-precoded, column addresses $Y_C$ and $Y_D$.

In the case where the column addresses $Y_A$ and $A_B$ are (1 from 8)-precoded and the column addresses $Y_C$ and $Y_D$ are (1 from 4)-precoded, respectively, an addressable column decoder CDEC' can drive $i = 8*8 = 64$ read amplifiers per read amplifier block LVB and $4*4 = 16$ of these addressable selection decoders CDEC' can be addressed. In the simplest case, given positive logic, only one address line $Y'_C$ and $Y'_D$ is required in each case for addressing the column decoder CDEC'. If a read amplifier block LVB consists, for example, of 64 read amplifiers, then exactly one bit line pair can be switched through to a pair of IO lines IO and ION by means of a 1-from-64-coded bit line selection signal. In many cases a plurality of pairs of IO lines IO and ION are present, and it is thus simultaneously possible to read out a plurality of bit line pairs in parallel, which has, however, no direct influence on the formation of the bit line selection signal. If, for example, two pairs of IO lines IO and ION are present, then only one selection decoder with a (2 from i)-coding and, for example, only 4 instead of 8 precoded column address lines $Y_B$ are required.

The gating of the bit line selection signals by an OR circuit OR is relatively complex, and hence is really only possible in principle. In FIG. 7a, therefore, further possibilities for generating a bit line block selection signal BSL within a column decoder CDEC are represented. As in FIG. 7, address lines $Y_A$ and $Y_B$ for coded, for example (1 from 8)-precoded, column addresses are connected to an addressable selection decoder CDEC''. As in FIG. 7, address lines $Y'_C$ and $Y'_D$ of the address lines $Y_C$ and $Y_D$ are used for addressing the addressable selection decoder CDEC'' and, in addition, address lines $Y'''_C$ and $Y'''_D$ of the address lines $Y_C$ and $Y_D$ are used for parallel formation of the bit line block selection signal in a supplementary circuit ZS, in which the address lines $Y'_C$, $Y'_D$ may be identical to the address lines $Y''_C$, $Y''_D$. If no parallel formation of the bit line block selection signal BSL is required for time reasons, then the bit line block selection signal BSL can be used for addressing a selection decoder of consequently simpler design, in which case the bit line block selection signal BSL is fed to a single addressing input $Y_{CD}$ of the addressable selection decoder CDEC'' for this purpose. In the simplest case, given positive logic, only one column address $Y''_C$ of the, for example, four lines for the (1 from 4)-precoded column address $Y_C$ and one line for the address $Y''_D$ of the, for example, four lines of the column address $Y_D$ are gated by a supplementary circuit in the form of an AND circuit to form a bit line block selection signal BSL. In the case of a more complicated precoding of the column addresses $Y_C$ and $Y_D$, given negative logic for example, l greater than or equal to one lines, for example three lines, may be required for direct addressing of the addressable selection decoder CDEC", and k greater than or equal to one line may be required for the supplementary circuit ZS.

Figure 8:
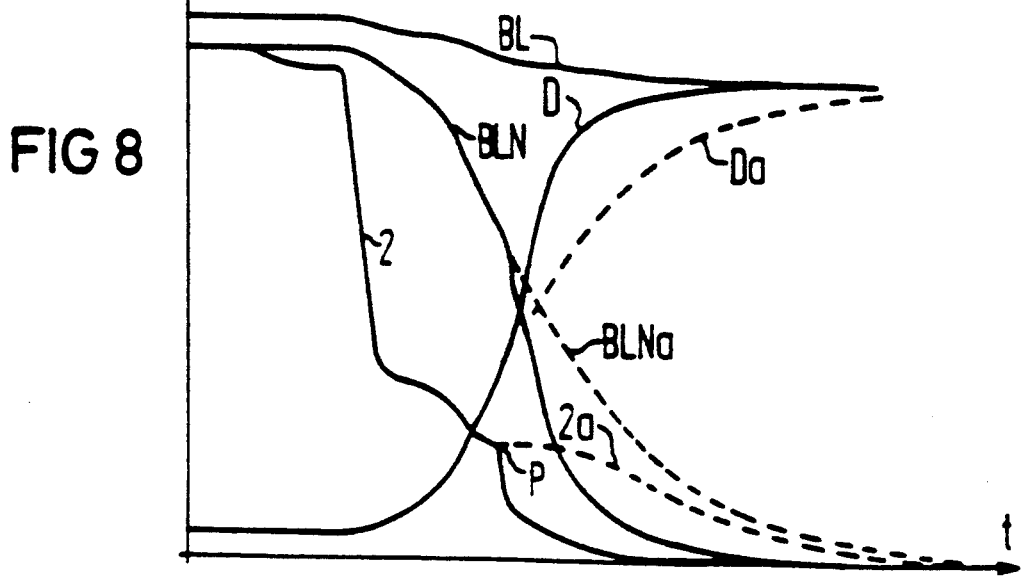
FIG. 8 shows a voltage-time diagram for representing the effect of the accelerator circuit of a semiconductor memory according to the invention.

The voltage-time diagram shown in FIG. 8 illustrates the improvement of the evaluation time as a result of the accelerator circuit of a dynamic semiconductor memory according to the invention, in which the parameter designation of a curve corresponds to the respective index of the voltage U. The voltage curves shown there are obtained in the case of non-activated p-channel parts of the read amplifiers. The voltage $U_2$ represents the voltage of the local SANN line, the accelerator circuit starting from the point P and allows the voltage $U_2$ to approach reference potential faster than would be the case without accelerator circuit and is indicated by the broken line for voltage $U_{2a}$. Provided that a memory cell connected to the bit line BL stores a logical 1, the voltage $U_{BL}$ will decrease only insignificantly when this memory cell is read, while the voltage $U_{BLN}$ will drop sharply towards reference potential, which results in a large increase in the differential voltage $U_D$. The voltage curves $U_{BLNa}$ of the comparison bit line shown by broken lines and the resulting differential voltage $U_{Da}$, likewise indicated by a broken line, show the curves without accelerator circuit for comparison purposes.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A dynamic semiconductor memory, comprising:
   a memory cell arrangement which has at least one word line block, said at least one word line block being composed of a multiplicity of bit line blocks, each of the bit line blocks having a multiplicity of bit line pairs;
   a multiplicity of read amplifier blocks, each of the read amplifier blocks having a multiplicity of read amplifiers, each of the read amplifiers being connected to a bit line pair of a bit line block which is allocated to a respective read amplifier block and being constructed from an n-channel part and a p-channel part;
   read amplifiers having amplified read signals that are switchable through to IO lines as a function of bit-line selection signals, the bit-line selection signals being produced by means of a column decoder;
   a multiplicity of local drivers, a respective local driver being provided for common drive of n-channel parts of read amplifiers of a respective read amplifier block;
   each of the local drivers, in order to achieve accelerated evaluation with a low peak current, additionally having an acceleration circuit with a driver transistor and being connected to a first terminal of the driver transistor; and
   each of the acceleration circuits that are drivable such that the accelerated evaluation takes place only in a read amplifier block in which amplified read signals are also switched through to the IO lines as a function of the bit-line selection signals.

2. The dynamic semiconductor memory as claimed in claim 1, wherein the accelerator circuit comprises only the driver transistor, wherein a second terminal of the driver transistor is directly drivable by a bit line block selection signal, provided that separate column decoders are provided for individual word line blocks, and wherein a third terminal of the driver transistor is directly connected to a reference potential line.

3. The dynamic semiconductor memory as claimed in claim 1, wherein the accelerator circuit consists only of the driver transistor, wherein, for driving, a second terminal of the driver transistor is connected to an output of a logic circuit and, by means of the logic circuit, a bit line block selection signal is gated with a word line block selection signal, inasmuch as a common, superordinate column decoder is provided for a plurality of word line blocks, and wherein a third terminal of the driver transistor is directly connected to a reference potential line.

4. The dynamic semiconductor memory as claimed in claim 3, wherein the logic circuit comprises an AND gate.

5. The dynamic semiconductor memory as claimed in claim 1, wherein the accelerator circuit includes the driver transistor and a selection transistor, wherein a second terminal of the driver transistor is directly drivable by a bit line block selection signal, wherein a third terminal of the driver transistor is connected to a first terminal of the selection transistor, wherein, in order to select a word line block, a second terminal of the selection transistor is drivable via a drive line of a local SAN driver, and wherein a third terminal of the selection transistor is connected to a reference potential line.

6. The dynamic semiconductor memory as claimed in claim 5, further comprising an n-phase local driver with n drive lines, wherein the second terminal of the selection transistor is drivable via a drive line of a temporally last, nth phase local driver.

7. The dynamic semiconductor memory as claimed in claim 1, wherein the column decoder includes an addressable selection decoder for generating bit line selection signals and a supplementary circuit for generating a bit line block selection signal, and wherein column address lines are connected to the selection decoder for forming the bit line selection signals.

8. The dynamic semiconductor memory as claimed in claim 7, wherein all bit line selection signals of the selection decoder are gated by means of a supplementary circuit in the form of an OR circuit to form a bit line block selection signal.

9. The dynamic semiconductor memory as claimed in claim 7, wherein the selection decoder includes an input for addressing, wherein an output of the supplementary circuit carrying the bit line block selection signal is connected to the input for addressing the selection decoder, and wherein inputs of the supplementary circuit are connected to further column address lines.

10. The dynamic semiconductor memory as claimed in claim 9, wherein the supplementary circuit consists of an AND gate.

11. The dynamic semiconductor memory as claimed in claim 7, wherein the selection decoder includes inputs for addressing, and these inputs being connected to further column address lines, and wherein inputs of the supplementary circuit are connected to the further column address lines.

12. The dynamic semiconductor memory as claimed in claim 1, wherein the accelerator circuit is connected to a first reference potential line, and wherein the local driver is connected to a second reference potential line which is separate from the first reference potential line.

* * * * *